(12) United States Patent
Meyer-Berg (10) Patent No.: US 8,193,040 B2
(45) Date of Patent: Jun. 5, 2012

(54) MANUFACTURING OF A DEVICE INCLUDING A SEMICONDUCTOR CHIP

(75) Inventor: Georg Meyer-Berg, Munich (DE)

(73) Assignee: Infineon Technologies AG, Neubiberg (DE)

( * ) Notice: Subject to any disclaimer, the term of this patent is extended or adjusted under 35 U.S.C. 154(b) by 158 days.

(21) Appl. No.: 12/701,779

(22) Filed: Feb. 8, 2010

(65) Prior Publication Data

US 2011/0193217 A1 Aug. 11, 2011

(51) Int. Cl.
*H01L 21/00* (2006.01)
(52) U.S. Cl. ............... 438/119; 438/118; 257/E21.214
(58) Field of Classification Search .................. 438/694, 438/689, 118, 119; 257/E21.214
See application file for complete search history.

(56) References Cited

U.S. PATENT DOCUMENTS

| | | | |
|---|---|---|---|
| 5,574,311 A * | 11/1996 | Matsuda | 257/697 |
| 5,737,191 A * | 4/1998 | Horiuchi et al. | 361/764 |
| 5,746,868 A * | 5/1998 | Abe | 156/247 |
| 6,538,210 B2 * | 3/2003 | Sugaya et al. | 174/258 |
| 6,861,370 B1 * | 3/2005 | Kasatani | 438/745 |
| 6,888,236 B2 * | 5/2005 | Hiramatsu et al. | 257/703 |
| 7,067,926 B2 * | 6/2006 | Yamazaki et al. | 257/777 |
| 7,157,372 B1 | 1/2007 | Trezza | |
| 7,215,032 B2 | 5/2007 | Trezza | |
| 7,482,272 B2 | 1/2009 | Trezza | |
| 7,671,609 B2 * | 3/2010 | Sato et al. | 324/755.11 |
| 7,737,707 B2 * | 6/2010 | Sato et al. | 324/754.03 |
| 2004/0144203 A1 * | 7/2004 | Unami et al. | 75/243 |
| 2008/0251903 A1 | 10/2008 | Otremba et al. | |
| 2008/0311738 A1 * | 12/2008 | Supriya et al. | 438/623 |
| 2009/0273075 A1 * | 11/2009 | Meyer-Berg | 257/693 |
| 2010/0127386 A1 * | 5/2010 | Meyer-Berg | 257/698 |
| 2010/0144152 A1 * | 6/2010 | Park et al. | 438/694 |
| 2010/0193801 A1 * | 8/2010 | Yamada et al. | 257/77 |

FOREIGN PATENT DOCUMENTS

DE 199 54 941 A1 6/2001
EP 1 230 680 B1 8/2002

* cited by examiner

*Primary Examiner* — Walter L Lindsay, Jr.
(74) *Attorney, Agent, or Firm* — Slater & Matsil, L.L.P.

(57) ABSTRACT

Metal particles are applied to a metal foil. A semiconductor chip is placed over the metal foil with contact elements of the semiconductor chip facing the metal particles. The metal particles are heated and the metal foil is structured after heating the metal particles.

33 Claims, 10 Drawing Sheets

MANUFACTURING OF A DEVICE INCLUDING A SEMICONDUCTOR CHIP

TECHNICAL FIELD

This invention relates to a method of manufacturing a device including a semiconductor chip. The invention further relates to a device including a semiconductor chip.

BACKGROUND

Semiconductor devices may include external contact elements over which the semiconductor chips included in the devices may be accessed from outside the devices. Electrically conductive means may be provided so as to provide the coupling between the semiconductor chips and the external contact elements.

Miniaturization is a continuing trend in integrated circuit packaging technology toward smaller scales for semiconductor devices. Various techniques may be used to produce smaller semiconductor packages, such as chip scale packaging, wafer level packaging or chip stacking.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

Devices containing one or more semiconductor chips are described below. The semiconductor chips may be of different types, may be manufactured by different technologies and may include, for example, integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Furthermore, the semiconductor chips may be configured as so-called MEMS (micro-electro mechanical systems) and may include micro-mechanical structures, such as bridges, membranes or tongue structures. The semiconductor chips may be configured as sensors or actuators, for example, pressure sensors, acceleration sensors, rotation sensors, magnetic field sensors, electro-magnetic field sensors, microphones, etc. The semiconductor chips may be configured as antennas and/or discrete passives and/or chip stacks. Semiconductor chips in which such functional elements are embedded generally contain electronic circuits which serve for driving the functional elements or further processing signals generated by the functional elements. The semiconductor chips need not be manufactured from specific semiconductor material, for example, Si, SiC, SiGe, GaAs, and, furthermore, may contain inorganic and/or organic materials that are not semiconductors, such as, for example, discrete passives, antennas, insulators, plastics or metals. Moreover, the semiconductor chips may be packaged or unpackaged.

The semiconductor chips may have contact elements (or contact pads or electrodes) which allow electrical contact to be made with the integrated circuits included in the semiconductor chips. One or more metal layers may be applied to the contact elements of the semiconductor chips. The metal layers may be manufactured with any desired geometric shape and any desired material composition. The metal layers may, for example, be in the form of a layer covering an area. Any desired metal or metal alloy, for example, from aluminum, titanium, gold, silver, copper, palladium, platinum, nickel, chromium or nickel vanadium, may be used as the material. In particular, it may be possible to firmly attach a sintered layer onto the surfaces of the contact elements or the surfaces of the metal layers covering the contact elements. For this purpose the contact elements or the metal layers covering the contact elements may be made of copper, nickel palladium or any other appropriate metal or metal alloy. The metal layers need not be homogenous or manufactured from just one material, that is to say, various compositions and concentrations of the materials contained in the metal layers are possible.

The devices may contain one or more metal foils (or metal sheets or metal layers). The metal foils may, for example, be used to produce redistribution layers. The metal foils may be used as wiring layers to make electrical contact with the semiconductor chips from outside the devices or to make electrical contact with other semiconductor chips and/or components contained in the devices. The metal foils may be manufactured with any desired geometric shape and any desired material composition. The metal foils may, for example, entirely consist of metals or metal alloys. The metal foils may, for example, be processed to conductor tracks, but may also be in the form of a layer covering an area. Any desired metals, for example, copper, aluminum, nickel, palladium, silver, tin or gold, metal alloys or metal stacks may be used as the material. The metal layers need not be homogenous or manufactured from just one material, that is to say various compositions and concentrations of the materials contained in the metal foils are possible. Furthermore, the metal foils may be arranged above or below or between electrically insulating layers.

Metal particles may be applied to the metal foils and/or the semiconductor chips. The metal particles may, for example, be made of silver, gold, copper, tin or nickel. The extensions (average diameter) of the metal particles may be smaller than 100 nm and, in particular, smaller than 50 nm or 10 nm or 5 nm. It may also be provided that only a fraction of the metal particles has such dimensions. For example, at least 10% or 20% or 30% or 40% or 50% or 60% or 70% of the metal particles may have dimensions smaller than 100 nm or 50 nm or 10 nm or 5 nm. The other metal particles may have larger dimensions. The metal particles may be coated with a layer of an organic material or a flux material, for example, colophony. Furthermore, the metal particles may be dispersed in a suitable liquid or solvent. After their application, the metal particles may be heated and thereby sintered. Heating of the metal particles may be carried out by placing the devices in an oven or on a hot plate or by conducting a current through at least one of the semiconductor chips, the metal foil and the metal particles. By sintering the metal particles a mechanical and/or electrical connection between the metal foil and the semiconductor chip may be established.

The devices may include an encapsulation material, which may be electrically insulating. The encapsulation material may cover any fraction of any number of surfaces of the components of the device. The encapsulation material may serve various functions. It may be used, for example, to electrically insulate components of the device from each other and/or from external components, but the encapsulation material may also be used as a platform to mount other components, for example, wiring layers. The encapsulation material may be used to produce fan-out type packages. In a fan-out type package at least some of the external contact elements and/or conductor tracks connecting the semiconductor chip to the external contact elements are located laterally outside of the outline of the semiconductor chip or at least intersect the outline of the semiconductor chip. Thus, in fan-out type packages, a peripherally outer part of the package of the semiconductor chip is typically (additionally) used for electrically bonding the package to external applications, such as application boards, etc. This outer part of the package encompassing the semiconductor chip effectively enlarges the contact area of the package in relation to the footprint of the semiconductor chip, thus leading to relaxed constraints in view of package pad size and pitch with regard to later processing, e.g., second level assembly.

The encapsulation material may be deposited on the components of the device using various techniques. For example, the encapsulation material may be deposited by printing or from a gas phase or a solution or by using any other appropriate method. The encapsulation material may, for example, contain silicone material or may entirely consist of silicone (or polymerized siloxanes or polysiloxanes). The encapsulation material may have an elastic modulus of, for example, less than 100 MPa. The encapsulation material may be thermally conducting so that it can dissipate the heat generated by the semiconductor chips. It may also be provided that the devices contain encapsulation material that is thermally insulating.

Furthermore, the encapsulation material may be any appropriate duroplastic, thermoplastic or thermosetting material or laminate (prepreg) and may contain filler materials. This kind of encapsulation material may be deposited, for example, by compression molding, injection molding, powder molding, potting, dispensing, jetting or lamination.

The devices described below include external contact elements, which may be of any shape, size and material. The external contact elements may be accessible from outside the device and may thus allow electrical contact to be made with the semiconductor chips from outside the device. Furthermore, the external contact elements may be thermally conducting and may serve as heat sinks for dissipating the heat generated by the semiconductor chips. The external contact elements may be composed of any desired electrically conducting material. The external contact elements may include external contact pads. Solder material may be deposited on the external contact pads. The solder material may have the shape of solder balls and may, for example, be composed of SnPb, SnAg, SnAgCu, SnAgCuNi, SnAu, SnCu and/or SnBi.

Figure 1A:
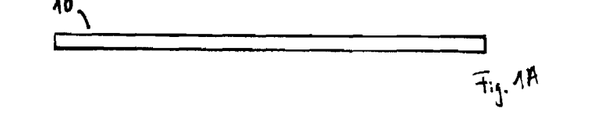
FIGS. 1A to 1E schematically illustrate a cross-sectional view of one embodiment of a method of manufacturing a device including a semiconductor chip, a metal foil and metal particles.
Figure 1B:
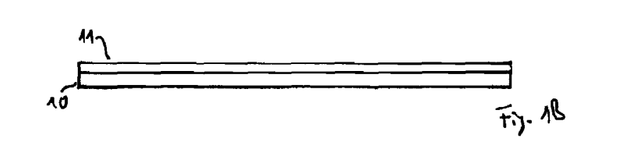
Figure 1C:
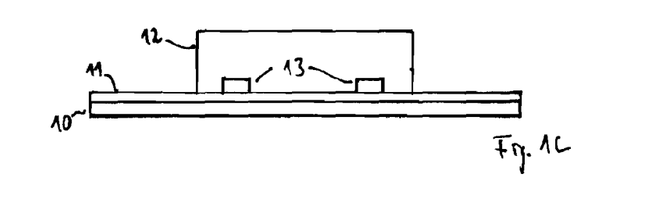
Figure 1D:
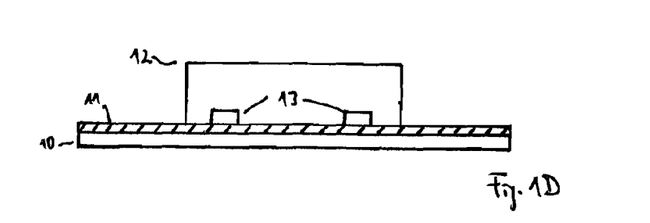
Figure 1E:
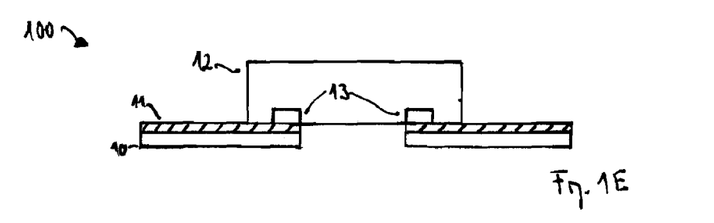

FIGS. 1A-1E schematically illustrate a cross-sectional view of a method of manufacturing a device 100, which is illustrated in FIG. 1E. Firstly, a metal foil 10 is provided (see FIG. 1A). Metal particles 11 are applied to the metal foil 10 (see FIG. 1B). A semiconductor chip 12 is provided which has contact elements 13 arranged on one surface of the semiconductor chip 12. The semiconductor chip 12 is placed over the metal foil 10 such that the contact elements 13 face towards the metal particles 11 (see FIG. 1C). The metal particles 11 are then heated and may thereby be sintered (see FIG. 1D). Finally, the metal foil 10 is structured (see FIG. 1E).

Figure 2:
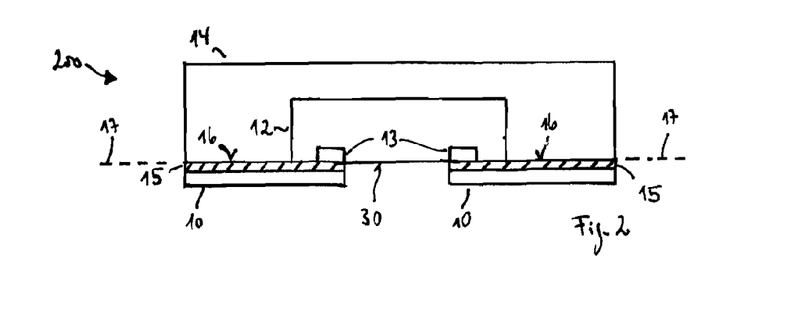
FIG. 2 schematically illustrates a cross-sectional view of one embodiment of a device including a semiconductor chip, a metal foil and sintered metal particles.

FIG. 2 schematically illustrates a cross-sectional view of a device 200. The device 200 includes a semiconductor chip 12 having contact elements 13, which are arranged on a first main surface 30 of the semiconductor chip 12. The semiconductor chip 12 is encapsulated by an encapsulation body 14. A surface 16 of the encapsulation body 14 and the first main surface 30 of the semiconductor chip 12 form a common plane 17. A layer 15 of sintered metal particles is applied to the common plane 17. Furthermore, a metal layer 10 is applied to the layer 15 of the sintered metal particles.

Figure 3A:
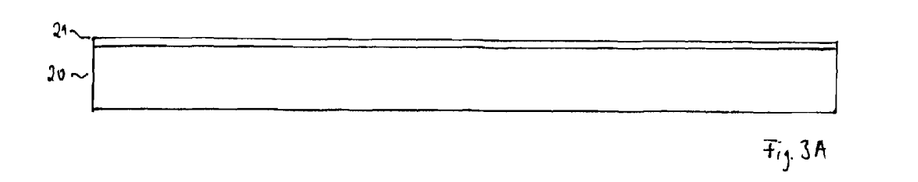
FIGS. 3A to 3M schematically illustrate a cross-sectional view of one embodiment of a method of manufacturing a device including a semiconductor chip, a metal foil, a mold material and sintered metal particles.
Figure 3B:
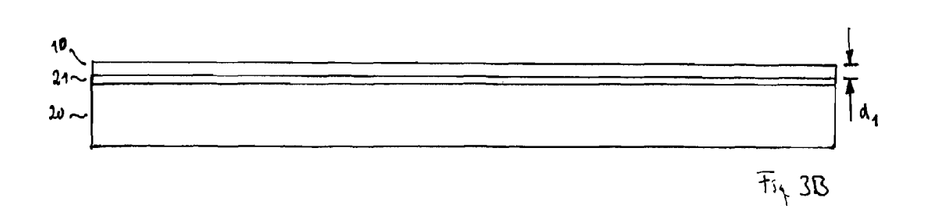
Figure 3C:
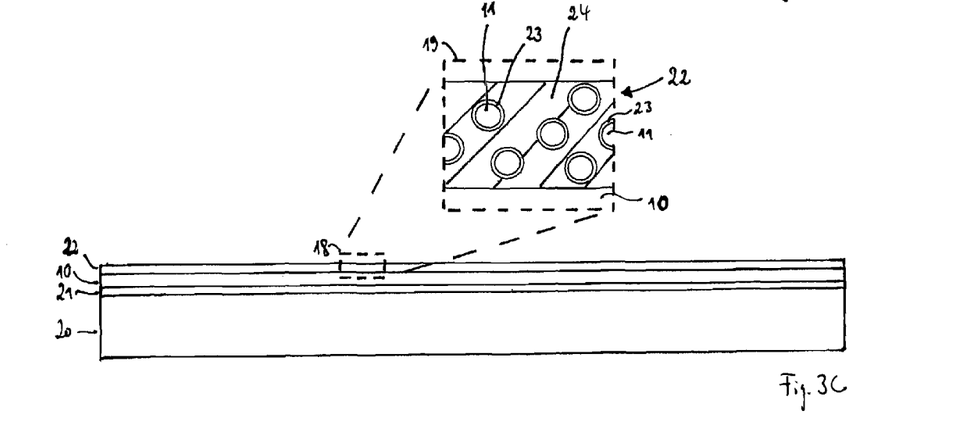
Figure 3D:
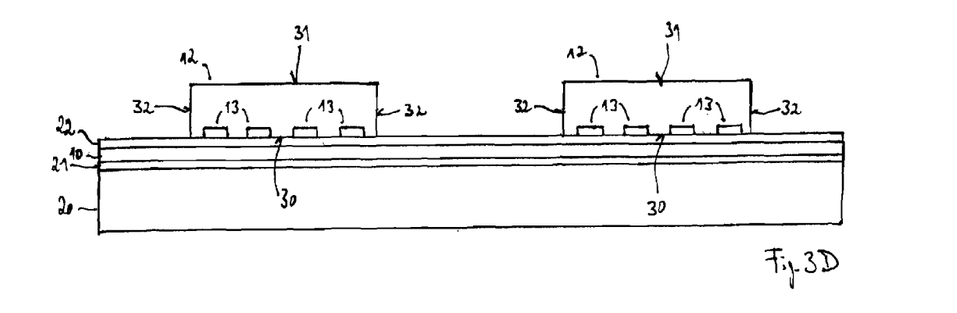
Figure 3E:
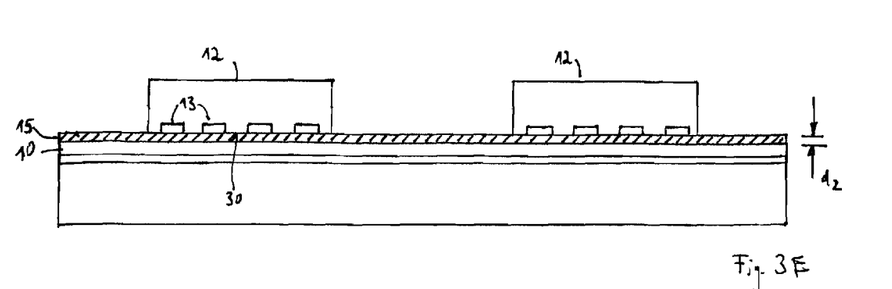
Figure 3F:
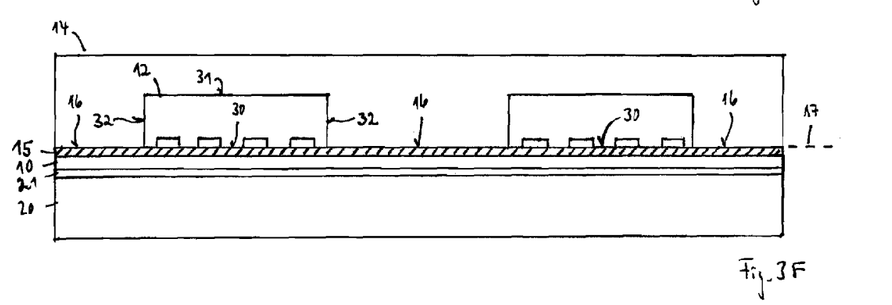
Figure 3G:
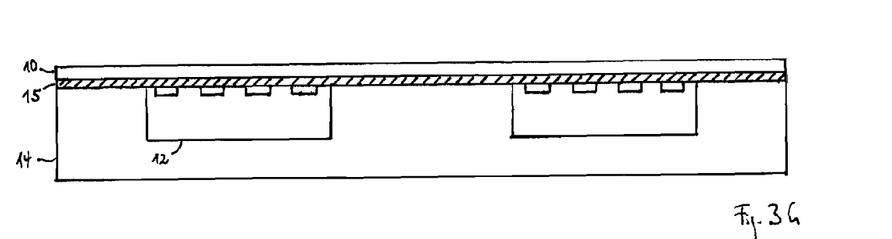
Figure 3H:
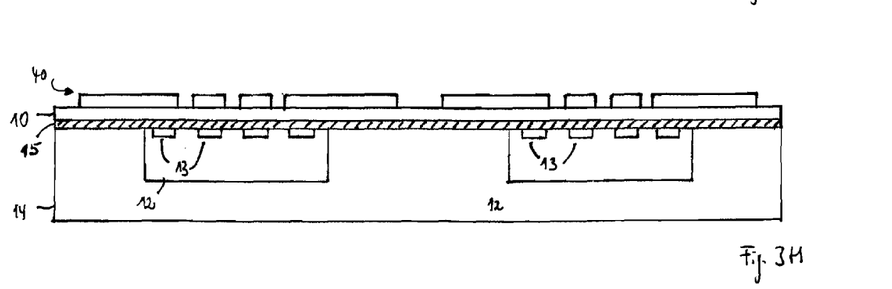
Figure 3I:
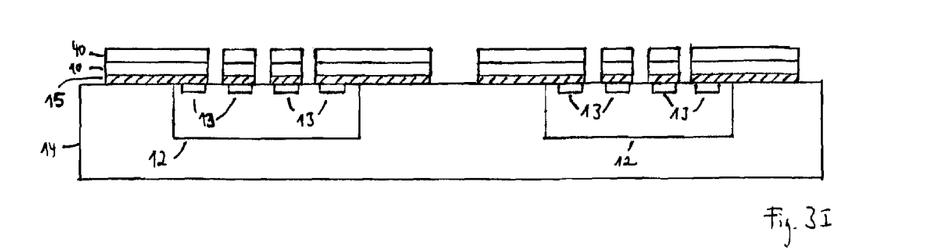
Figure 3J:
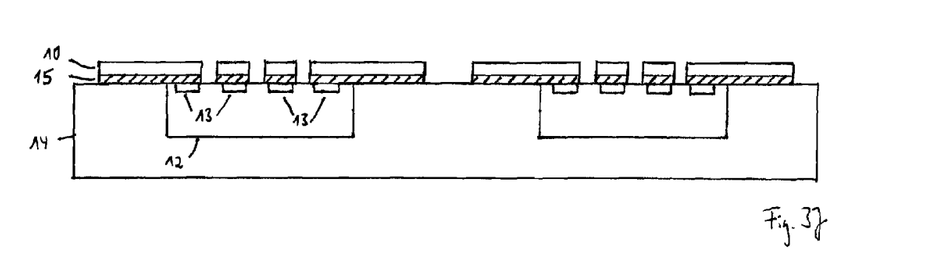
Figure 3K:
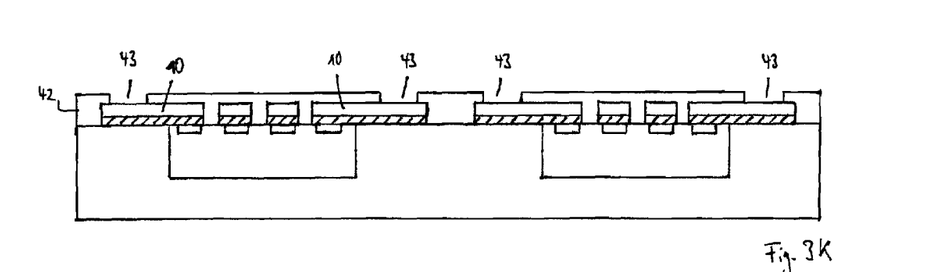
Figure 3L:
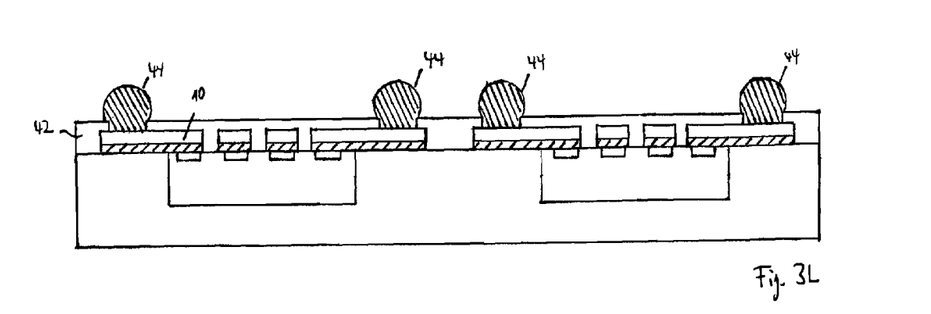
Figure 3M:
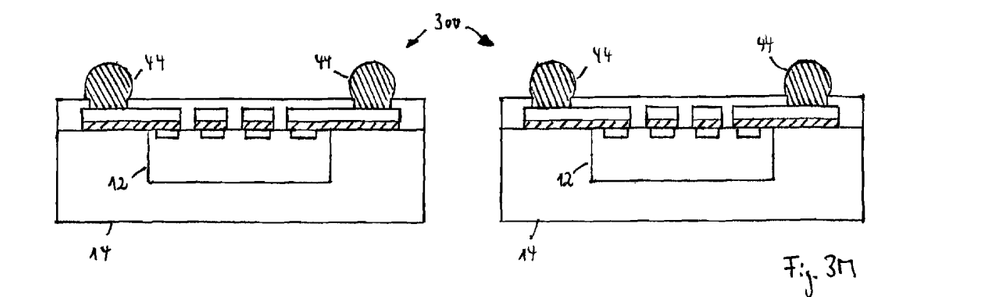

FIGS. 3A-3M schematically illustrate a cross-sectional view of one embodiment of a method of manufacturing a device 300, which is illustrated in FIG. 3M. The manufacturing method illustrated in FIGS. 3A-3M is an implementation of the manufacturing method illustrated in FIGS. 1A-1E. The details of the manufacturing method that are described below can therefore be likewise applied to the method of FIGS. 1A-1E. Moreover, the device 300 is an implementation of the device 200 illustrated in FIG. 2. The details of the device 300 that are described below can therefore be likewise applied to the device 200. Similar or identical components of the devices 100, 200 and 300 are denoted by the same reference numerals.

As illustrated in FIG. 3A, a carrier 20 is provided. The carrier 20 may be a plate or a foil made of a rigid material, for example, a metal or a metal alloy, such as copper, aluminum, nickel, CuFeP, steel or stainless steel, laminate, film, polymer composites, ceramics or a material stack. The carrier 20 may have a flat upper surface on which the semiconductor chips 12 can be placed later on. The shape of the carrier 20 is not limited to any geometric shape, and the carrier 20 may have any appropriate size. For example, the thickness of the carrier 20 may be in the range from 50 μm to 1 mm. An adhesive tape 21, for example, a double sided sticky tape, may be laminated onto the carrier 20.

A metal foil 10 may be attached to the upper surface of the adhesive tape 21. According to one embodiment, the metal foil 10 has a thickness $d_1$ in the range from 5 to 10 μm and, in particular, from 6 to 8 μm. The metal foil 10 may, for example, be homogenous and may not be structured. According to one embodiment, the metal foil 10 entirely consists of a metal or a metal alloy. The material of which the metal foil 10 is made may be copper or silver or gold or any other metal or metal alloy which allows the attachment of metal particles by a sinter process as described below.

As shown in FIG. 3C a paste 22 containing metal (nano-) particles 11 is deposited onto the metal foil 10. A small segment 18 of the paste 22 is magnified and shown as a magnified segment 19. The metal particles 11 may, for example, be made of a metal, such as silver, gold, copper, tin or nickel. According to one embodiment, the metal particles 11 may be made of a pure metal or of a metal alloy. The extensions (average diameter) of the metal particles 11 may be smaller than 100 nm and, in particular, smaller than 50 nm or 10 nm. It may also be provided that only a fraction of the metal particles 11, which are applied to the metal foil 10, has such dimensions. For example, at least 10% or 20% or 30% or 40% or 50% or 60% or 70% of the metal particles 11 may have dimensions smaller than 100 nm or 50 nm or 10 nm. The other metal particles 11 may have larger dimensions.

The metal particles 11 may be coated with a layer 23 of an organic material or a flux material, for example, colophony. Furthermore, the metal particles 11 may be dispersed in a suitable liquid or solvent 24. The paste 22 containing the metal particles 11 may be fluid, viscous or waxy. Pastes containing metal particles, which are coated with a layer of an organic or flux material and dispersed in a solvent, can, for example, be purchased from the companies Coocson Electronic (product name: N 1000), Advanced Nano-Particles (ANP), Harima Chemicals (product names: NPS-H and NHD-1), NBE Technologies (product name: NBE Tech) or Heraeus (product name: LTS 116). Other products from these or other companies may alternatively be used and may serve the same purpose as described below.

The application of the paste 22 containing the metal particles 11 dispersed in the solvent 24 may be performed by stencil printing or other printing technologies. Moreover, the paste may be distributed by a squeegee. Other techniques for the application of the paste 22 to the metal foil 10 are also possible, for example, dispensing or spin-coating. The paste 22 may be homogeneously distributed over the carrier 20.

One of the tasks of the solvent 24 may be to enable the metal particles 11 to be applied to the surface of the metal foil 10. Therefore, the solvent 24 may be chosen such that, depending on the application technique, it is fluid, viscous or waxy during the application of the paste 22. The layers 23 coating the metal particles 11 may prevent premature agglomeration of the metal particles 11.

As illustrated in FIG. 3D, two semiconductor chips 12 as well as possibly further semiconductor chips are placed over the paste 22 deposited on the carrier 20. Any suitable array of semiconductor chips 12 may be placed over the carrier 20 (only two of the semiconductor chips 12 are shown in FIG. 3D). For example, more than 50 or 500 or 1000 semiconductor chips 12 may be placed on the carrier 20. The semiconductor chips 12 are relocated on the carrier 20 in larger spacings as they have been in the wafer bond. The semiconductor chips 12 may have been manufactured on the same semiconductor wafer, but may alternatively have been manufactured on different wafers. Furthermore, the semiconductor chips 12 may be physically identical, but may also contain different integrated circuits and/or represent other components and/or may have different outer dimensions and/or geometries. The semiconductor chips 12 may have a thickness in the range between 50 μm and several hundred micrometers.

The semiconductor chips 12 have first main surfaces 30, second main surfaces 31 opposite to the first main surfaces 30 and side surfaces 32. The first main surfaces 30 may be the active surfaces of the semiconductor chips 12 and the contact elements 13 may be located on the first main surfaces 30. The integrated circuits embedded in the semiconductor chips 12 can be electrically accessed via the contact elements 13, which may be made of a metal or metal alloy, for example, copper or nickel palladium. The semiconductor chips 12 may be placed on the paste 22 with their first main surfaces 30 facing the paste 22 and their second main surfaces 31 facing away from the paste 22.

A pick-and-place tool may be used capable of picking the semiconductor chips 12 and placing them on the carrier 20. Furthermore, the semiconductor chips 12 may be pressed onto the carrier 20 such that the paste 22 is pressed into the cavities accommodating the contact elements 13. The semiconductor chips 12 may adhere to the paste 22 to such a degree which is sufficient for the manufacturing process.

After the placement of the semiconductor chips 12, the paste 22 containing the metal particles 11 may be exposed to a temperature $T_1$, which is high enough that the solvent 24 and the layers 23 coating the metal particles 11 sublimate or evaporate. Furthermore, the temperature $T_1$ may be lower than the melting temperature of the metal of which the metal particles 11 are made, but the temperature $T_1$ may be high enough to initiate a sintering process of the metal particles 11. After the solvent 24 and the layers 23 are removed, the metal particles 11 may thus form a solid layer 15 due to their sintering as illustrated in FIG. 3E. The temperature $T_1$ may be in the range from 150 to 450° C., in particular, in the range from 180 to 300° C. and may depend on the material of the metal particles 11. During the sinter process the semiconductor chips 12 may be pressed towards the carrier 20.

The sintering process of the metal particles 11 leads to a firm mechanical joint between the semiconductor chips 12 and the metal foil 10. Furthermore, the sintered layer 15 establishes an electrical coupling of the contact elements 13 of the semiconductor chips 12 to the metal foil 10. The sintered layer 15 may be of any thickness $d_2$, in particular, its thickness $d_2$ may be in the range from 1 to 30 μm. Pores may be distributed over the sintered layer 15.

According to one embodiment, at least portions of the outer surface of the first main surfaces 30 of the semiconductor chips 12 are a passivation layer. If the passivation layer is made of an appropriate material, such as silicon nitride or silicon dioxide, this allows the passivation layer to form a firm mechanical joint with the solid layer 15 due to the sintering process.

For producing the sintered joint, the carrier 20 may be heated by a hot plate to the temperature $T_1$. Alternatively, both the carrier 20 and the semiconductor chips 12 may be placed in an oven and heated to an appropriate temperature. During the sintering process the semiconductor chips 12 may be pressed onto the carrier 20 for an appropriate time.

The layers 23 coating the metal particles 11 before the sintering process may prevent oxidation of the metal particles 11. If an outer layer of the metal particles 11 is oxidized, a higher temperature $T_1$ would be required to sinter the metal particles 11. Furthermore, the sinter temperature $T_1$ may be reduced by reducing the diameters or dimensions of the metal particles 11. Due to the different thermal expansion coefficients of the semiconductor chips 12 and the metal foil 10 a low temperature $T_1$ is desired to reduce the mechanical stress induced into the semiconductor chips 12 by the metal foil 10 during the sintering process. As an example, copper of which the metal foil 10 may be manufactured has a thermal expansion coefficient of about $17 \times 10^{-6}$/K and silicon has a thermal expansion coefficient of about $3 \times 10^{-6}$/K.

A mold transfer process may be carried out to encapsulate the semiconductor chips 12 with a mold material 14 as illustrated in FIG. 3F. The mold material 14 may cover the second main surfaces 31 and the side surfaces 32 of the semiconductor chips 12, but leaves the first main surfaces 30 of the semiconductor chips 12 uncovered. Furthermore, the mold material 14 covers the exposed portions of the upper surface of the sintered layer 15. After the molding process the first main surfaces 30 of the semiconductor chips 12 and the lower surface 16 of the mold material 14 form a common plane 17 which is attached to the sintered layer 15.

The mold material 14 may be composed of any appropriate electrically insulating duroplastic, thermoplastic or thermosetting material, in particular, it may be composed of a material commonly used in contemporary semiconductor packaging technology. Various techniques may be employed to cover the semiconductor chips 12 with the mold material 14, for example, compression molding, injection molding, powder molding or liquid molding.

Instead of the mold material 14, another polymer material may be used as the encapsulating material to cover the semiconductor chips 12. The polymer material may have the shape of an electrically insulating foil or sheet, which is laminated on top of the semiconductor chips 12 as well as the sintered layer 15. Heat and pressure may be applied for a time suitable to attach the polymer foil or sheet to the underlying structure. The gaps between the semiconductor chips 12 are also filled with the polymer material. The polymer material may, for example, be a prepreg (short for preimpregnated fibers) that is a combination of a fiber mat, for example glass or carbon fibers, and a resin, for example a duroplastic material. Prepreg materials are usually used to manufacture PCBs (printed circuit boards). Well known prepreg materials that are used in PCB industry and that can be used here as the polymer material are: FR-2, FR-3, FR-4, FR-5, FR-6, G-10, CEM-1, CEM-2, CEM-3, CEM-4 and CEM-5. Prepreg materials are bi-stage materials, which are flexible when applied over the semiconductor chips 12 and hardened during a heat-treatment. For the lamination of the prepreg the same or similar process steps can be used as in PCB manufacturing.

The semiconductor chips 12 covered with the encapsulating material 14 are released from the carrier 20 and the adhesive tape 21 as illustrated in FIG. 3G. The adhesive tape 21 may feature thermo-release properties, which allow the removal of the adhesive tape 21 during a heat-treatment. The removal of the adhesive tape 21 from the metal foil 10 is carried out at an appropriate temperature, which depends on the thermo-release properties of the adhesive tape 21 and is usually higher than 150° C.

After the removal of the carrier 20 and the adhesive tape 21 the metal foil 10 is exposed and may be structured to build up a redistribution layer. The metal foil 10 may be structured by an etching process. For this purpose, an etching mask 40 is applied to the exposed surface of the metal foil 10 as illustrated in FIG. 3H. The etching mask 40 may consist of photoresist or any other appropriate material. A photoresist layer may be printed or spin-coated on top of the exposed surface of the metal foil 10. By exposure to light having a suitable wavelength through a mask and subsequent development, recesses are formed in the photoresist layer as illustrated in FIG. 3H.

In order to be able to apply the etching mask 40 to the appropriate positions, i.e., to the positions of the semiconductor chips 12, photo imaging may be performed to detect the positions and angles of the semiconductor chips 12 encapsulated in the encapsulation body 14. When the semiconductor chips 12 are heated, the positions of their contact elements 13 can be detected by using an infrared camera. Furthermore, the positions of the contact elements 13 may be detected by small bumps of the metal foil 10 at the locations of the contact elements 13.

Subsequently, an appropriate etching agent may be applied to the etching mask 40 thereby etching the portions of the metal foil 10 and the sintered metal layer 15 which are exposed from the etching mask 40 as illustrated in FIG. 3I. After the etching process the etching mask 40 may be stripped away by using an appropriate solvent. The metal foil 10 then has the form of conductor tracks of a wiring layer as illustrated in FIG. 3J.

A dielectric layer 42 may be deposited onto the structured metal foil 10 as illustrated in FIG. 3K. The dielectric material may be deposited from a gas phase or from a solution, or can be laminated onto the underlying structure. Furthermore, thin-film technology methods or a standard PCB industry process flow can be used for application of the dielectric layer 42. In order to make electrical contacts, the dielectric layer 42 may, for example, be opened by using photolithographic methods and/or etching methods and/or laser techniques. The openings of the dielectric layer 42 exposing portions of the structured metal foil 10 form external contact pads 43.

Solder deposits 44, for example, solder balls or solder half-spheres, may be placed onto the external contact pads 43 as illustrated in FIG. 3L. The solder deposits 44 may be applied by ball placement or any other appropriate technique. The dielectric layer 42 may be a solder stop layer that prevents solder from bridging between the conductor tracks and creating short circuits. The dielectric layer 42 also provides protection from the environment. The layer of the sintered metal particles 15 ensures that the contact elements 13 of the semiconductor chip 12 are electrically coupled to the external contact pads 43 and the solder deposits 44.

As illustrated in FIG. 3M, the devices 300 are separated from one another by separation of the encapsulation material 14 and the redistribution layer, for example, by sawing, cutting, milling, etching or a laser beam.

The devices 300 manufactured by the method described above are fan-out type packages. The encapsulation material 14 allows the redistribution layer to extend beyond the outline of the semiconductor chip 12. The external contact elements 43, 44 therefore do not need to be arranged within the outline of the semiconductor chip 12 but can be distributed over a larger area. At least some of the external contact elements 43, 44 may be arranged completely outside of the outline of the semiconductor chip 12. The increased area which is available for arrangement of the external contact elements 43, 44 as a result of the encapsulation material 14 means that the external contact elements 43, 44 cannot only be arranged at a great distance from one another, but that the maximum number of external contact elements 43, 44 which can be arranged there is likewise increased compared to the situation when all the external contact elements 43, 44 are arranged within the outline of the semiconductor chip 12.

It is obvious to a person skilled in the art that the devices 300 illustrated in FIG. 3M and the manufacturing thereof as described above are only intended to be an exemplary embodiment, and many variations are possible. For example, further semiconductor chips or passives of different types may be included in the same device 300. The semiconductor chips and passives may differ in function, size, manufacturing technology, etc. Moreover, the redistribution layer may include exactly one metal foil as in the device 300 or, alternatively, more than one metal layer.

Figure 4A:
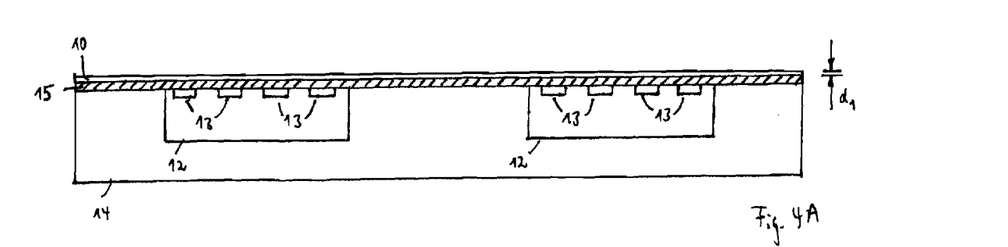
FIGS. 4A to 4E schematically illustrate a cross-sectional view of one embodiment of a method of manufacturing a device including a semiconductor chip, a metal foil, a mold material and sintered metal particles.

According to one embodiment, the thickness $d_1$ of the metal foil 10 is much smaller than 5 to 10 μm as stated above. For example, the thickness $d_1$ may be smaller than 1 μm and may be in the range of several hundred nanometers. This embodiment is schematically illustrated in FIGS. 4A-4E. FIG. 4A illustrates the fabrication step where the encapsulation body 14 containing the semiconductor chips 12 has been released from the carrier 20 and one surface of the metal foil 10 is exposed (similar to FIG. 3G).

In the next step, the metal foil 10 may be reinforced by depositing another metal layer onto the metal foil 10. The metal foil 10 can be used as an electrode for a galvanic deposition of the further metal layer, which may, for example, be made of copper and may have a thickness of several micrometer.

Figure 4B:
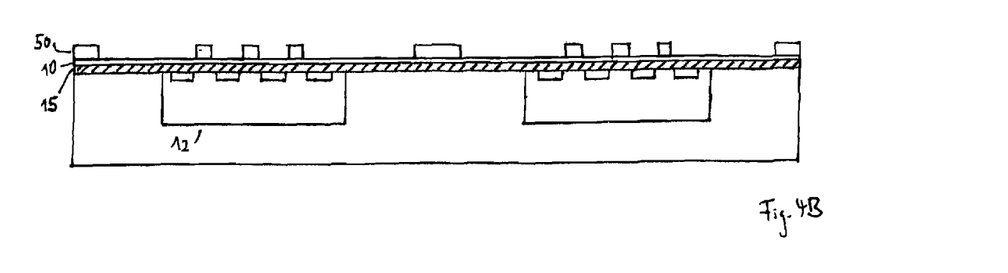

A photoresist layer 50 may be printed or spin-coated on top of the metal foil 10 as illustrated in FIG. 4B. By exposure to light having a suitable wavelength through a mask and subsequent development, recesses are formed in the photoresist layer 50 as illustrated in FIG. 4B. The structured photoresist layer 50 may have the inverted (or negative) structure of the etching mask 40 illustrated in FIG. 3H.

Figure 4C:
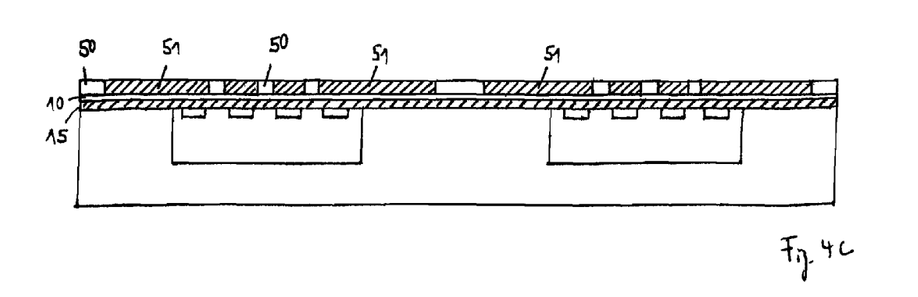

Subsequently, the portions of the metal foil 10 exposed by the recesses in the photoresist layer 50 may be reinforced by galvanic deposition of a further metal layer 51 as illustrated in FIG. 4C. During the galvanic deposition of the metal layer 51, the metal foil 10 is employed as an electrode. Copper or other metals or metal alloys may be plated onto the metal foil 10 in the unmasked areas and to the desired height, which is usually greater than 5 μm.

Figure 4D:
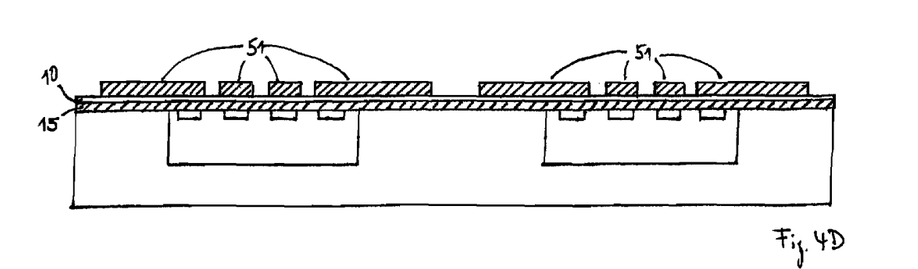
Figure 4E:
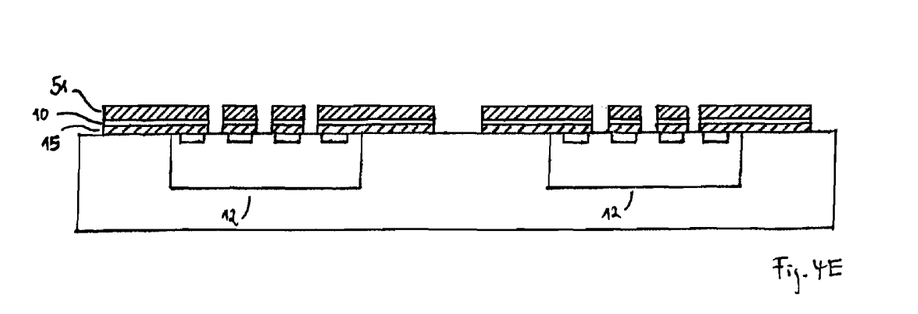

After the plating of the metal layer 51 the photoresist layer 50 is stripped away by using an appropriate solvent as illustrated in FIG. 4D. The now exposed portions of the original metal film 10 (and the underlying portions of the sintered layer 15), which have not been covered with the metal layer 51, may be removed by a brief etching step thereby creating separated conductor lines and metal pads as illustrated in FIG. 4E. Thereafter, the same fabrication steps may be carried out as illustrated in FIGS. 3K-3M.

The fabrication method illustrated in FIGS. 4A-4E allows to create structures of the metal foil 10 as small as about 1 μm, whereas the smallest structures that can be created by the fabrication method illustrated in FIGS. 3A-3M are about twice the thickness of the metal foil 10, i.e., 10 to 20 μm.

Figure 5A:
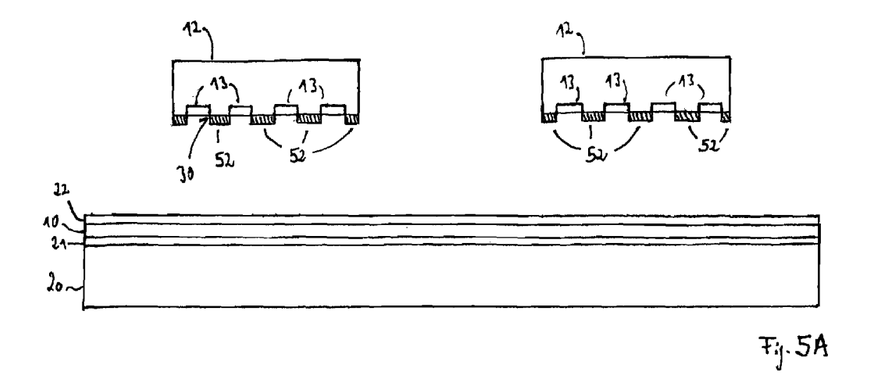
FIGS. 5A to 5C schematically illustrate a cross-sectional view of one embodiment of a method of manufacturing a device including a semiconductor chip, a metal foil, a mold material and sintered metal particles.
Figure 5B:
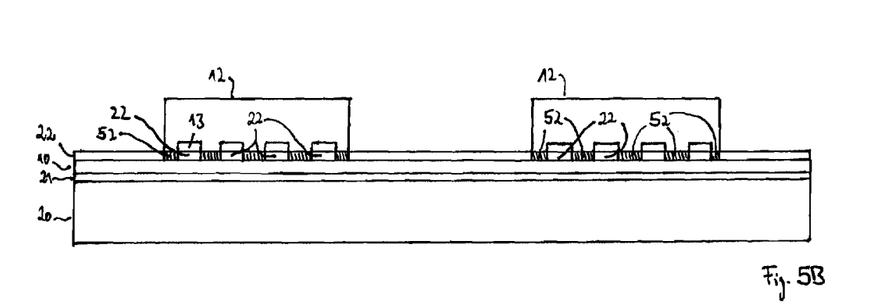
Figure 5C:
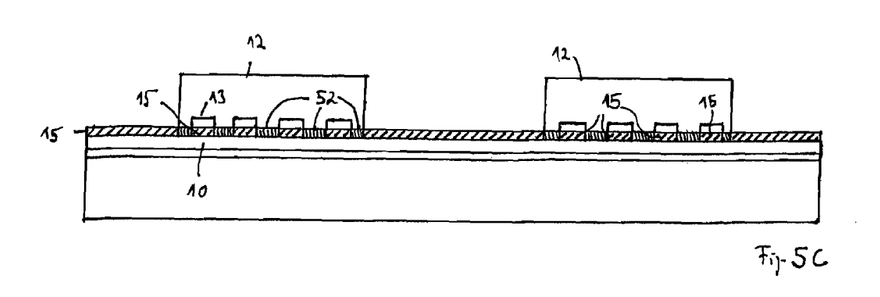

Another variation of the fabrication method of FIGS. 3A-3M is schematically illustrated in FIGS. 5A-5C. In this embodiment, the first main surface 30 of the semiconductor chips 12 is not coated with silicon nitride or silicon dioxide, but rather with a material, such as a polyimide material, which does not allow to produce a mechanical joint with the metal particles 11 in the sintering process. Therefore, the first main surfaces 30 of the semiconductor chips 12 are coated with an adhesive material 52 before the semiconductor chips 12 are placed over the carrier 20 as illustrated in FIG. 5A. The contact elements 13 of the semiconductor chips 12 are exposed from the adhesive material 52, i.e., they are not covered with the adhesive material 52. The thickness of the layer of the adhesive material 52 may be in the range from 1 to 10 μm.

The semiconductor chips 12 are pressed onto the carrier 20 such that the paste 22 is pushed away in the areas of the adhesive material 52. In these areas the adhesive material 52 is in direct contact with the upper surface of the metal foil 10 as illustrated in FIG. 5B. In the areas of the contact elements 13, the paste 22 is located between the contact elements 13 and the metal foil 10. The paste 22 may exhibit a high thixotropy which allows to press the paste 22 into the cavities formed in the areas of the contact elements 13.

When the sintering process is performed as described above and illustrated in FIG. 5C, a sintered layer 15 is formed between the contact elements 13 of the semiconductor chips 12 and the metal foil 10. The sintered layer 15 establishes an electrical coupling between the contact elements 13 and the metal foil 10. According to one embodiment the sintering process leads to a firm mechanical connection between the sintered layer 15 and the adhesive material 52.

According to one embodiment, the adhesive material 52 is cured and thereby hardened by a heat treatment at appropriate temperatures, which may, for example, be higher than the temperature $T_1$ used for sintering the metal particles 11. According to one embodiment, the adhesive material 52 is cured during the sintering process. The heat treatment may be performed by using a hot plate or an oven. The adhesive material 52 then ensures a mechanical connection between the semiconductor chips 12 and the metal foil 12. Thereafter, the same fabrication steps may be carried out as illustrated in FIGS. 3F-3M.

Figure 6A:
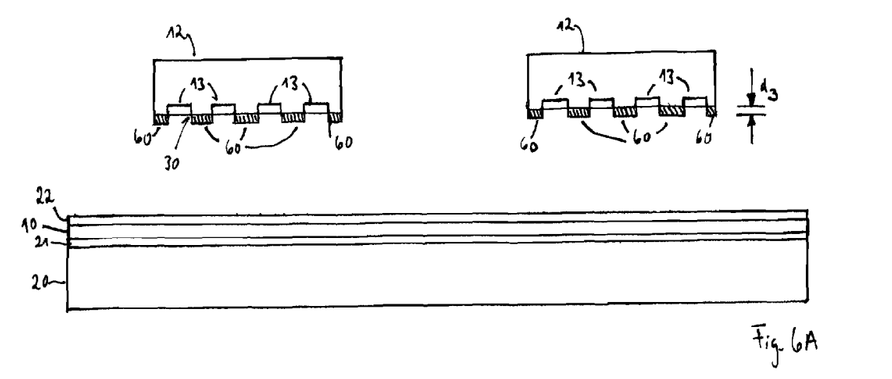
FIGS. 6A to 6H schematically illustrate a cross-sectional view of one embodiment of a method of manufacturing a device including a semiconductor chip, a metal foil, an elastic material and sintered metal particles.
Figure 6B:
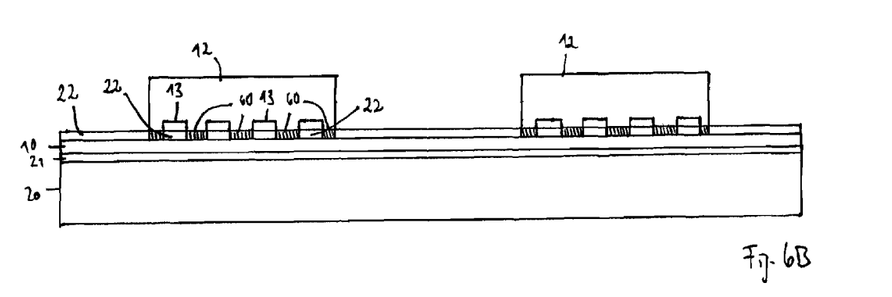
Figure 6C:
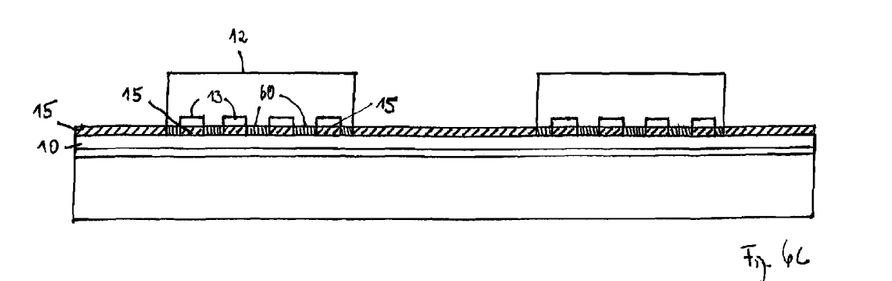
Figure 6D:
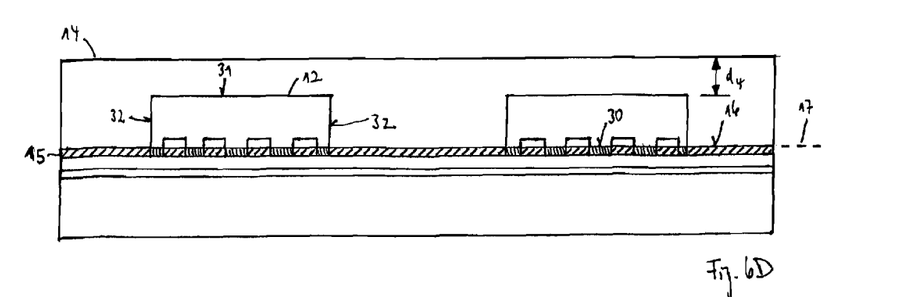
Figure 6E:
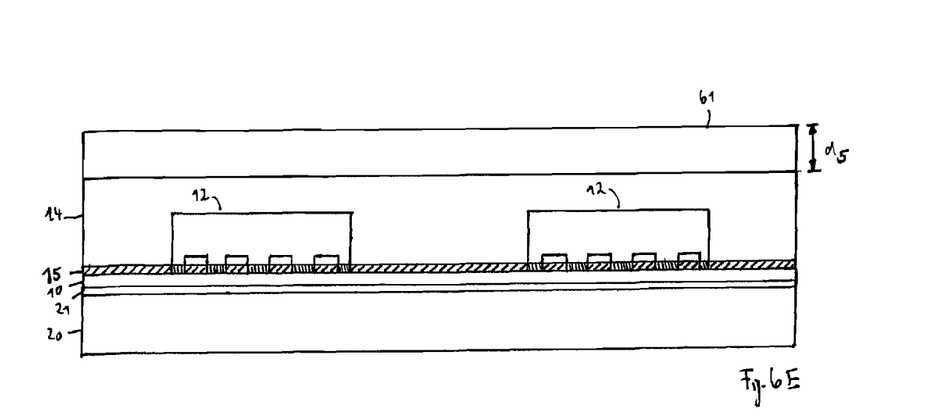
Figure 6F:
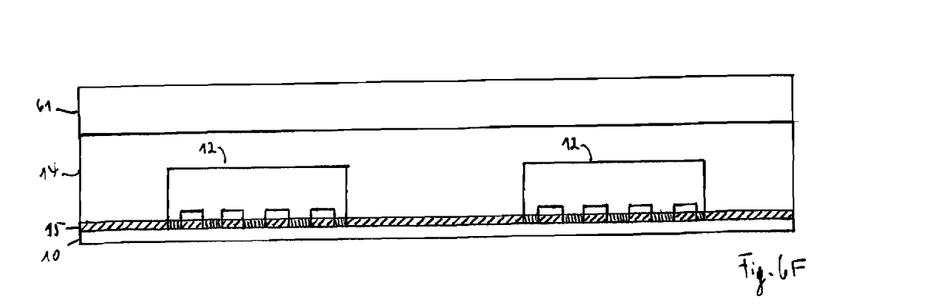
Figure 6G:
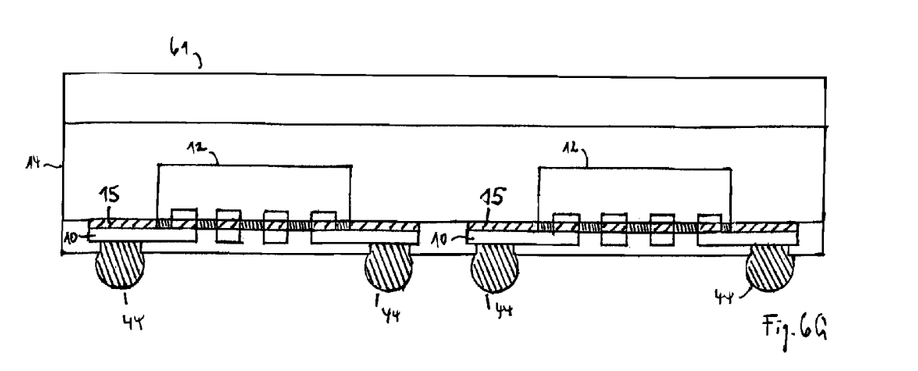
Figure 6H:
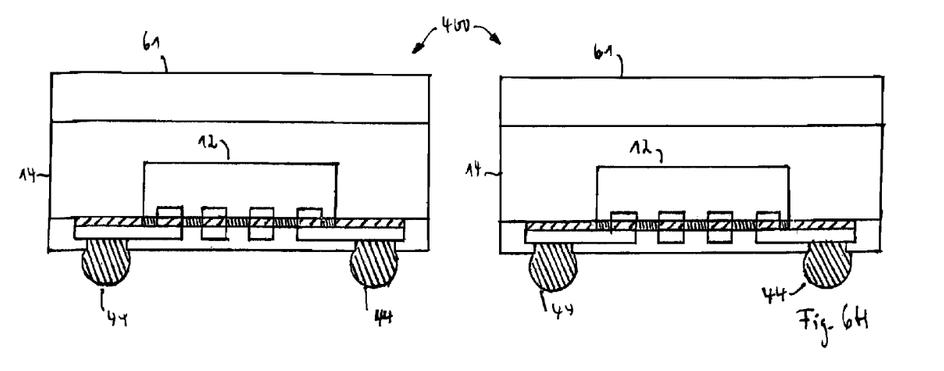

FIGS. 6A-6H schematically illustrate a cross-sectional view of one embodiment of a method of manufacturing a device 400, which is illustrated in FIG. 6H. The manufacturing method illustrated in FIGS. 6A-6H is partially identical to the manufacturing method illustrated in FIGS. 3A-3M. Therefore, it is referred to the method of FIGS. 3A-3M in the following where appropriate.

As described above in connection with FIGS. 3A-3C, the carrier 20 with the adhesive tape 21 is provided and the metal foil 10 is attached to the adhesive tape 21. The paste 22 containing the metal particles 11 is deposited on the metal foil 10. In contrast to the embodiment of FIGS. 3A-3M, the first main surfaces 30 of the semiconductor chips 12 are coated with an adhesive material 60 before the semiconductor chips 12 are placed over the carrier 20 as illustrated in FIG. 6A.

The adhesive material 60 may be made of a polymer or any other suitable material. The adhesive material 60 may contain silicone, i.e., polymerized siloxanes or polysiloxanes, or fluorinated silicone or may be entirely made of silicone. The adhesive material 60 may further be a mixture of silicone and epoxy resin or a mixture of silicone and polyimide. After hardening, the adhesive material 60 may have an elastic modulus of less than 100 MPa, in particular, less than 50 MPa or 20 MPa or 10 MPa or 5 MPa or 2 MPa or 1 MPa or 500 kPa or 200 kPa or 100 kPa or 50 kPa or 20 kPa. The elastic modulus is also known as the Young's modulus, modulus of elasticity or tensile modulus. The elastic modulus may be defined as the ratio of stress, which has units of pressure, to strain, which is dimensionless; therefore the elastic modulus itself has units of pressure.

The elastic modulus of the adhesive material 60 as described above may allow a floating mounting of the semiconductor chips 12. Due to the different thermal expansion coefficients of the semiconductor chips 12 and the metal foil 10, floating mounting of the semiconductor chip 12 is desired to reduce the mechanical stress induced during temperature cycles.

The adhesive material 60 may have a thermal conductivity, for example, in the range between 0.1 W/mK and 5 W/mK or higher. Alternatively, the adhesive material 60 may be thermally insulating. The adhesive material 60 may exhibit low outgassing during cure and in particular high thixotropy. Elastosil may be used for the adhesive material 60, for example, Elastosil RT705, which is commercially available.

When deposited on the semiconductor chips 12 the adhesive material 60 may be fluid, viscous or waxy. The deposition of the adhesive material 60 may, for example, be performed by stencil printing, screen printing, dispensing or any other appropriate method. The thickness $d_3$ of the adhesive material 60 when deposited on the semiconductor chips 12 may be at least 1 μm or at least 10 μm and, in particular, around 30 μm. The contact elements 13 of the semiconductor chips 12 are exposed from the adhesive material 60, i.e., they are not covered with the adhesive material 60. If the adhesive material 60 is also deposited on the contact elements 13 of the semiconductor chips 12, the adhesive material 60 may be removed from the contact elements 13 by, for example, laser ablation.

According to one embodiment, the semiconductor chips 12 are pressed onto the carrier 20 such that the paste 22 is pushed away in the areas of the adhesive material 60. In these areas the adhesive material 60 is in direct contact with the upper surface of the metal foil 10 as illustrated in FIG. 6B. In the areas of the contact elements 13, the paste 22 is located between the contact elements 13 and the metal foil 10. The paste 22 may exhibit a high thixotropy which allows to press the paste 22 into the cavities formed in the areas of the contact elements 13.

According to one embodiment, the semiconductor chips 12 do not necessarily push away the paste 22 when the semiconductor chips 12 are placed on the carrier 20. In this case the adhesive material 60 may be semi-cured before the semiconductor chips 12 are placed on the carrier 20. Subsequently a layer of micro-fine oxidic particles is deposited onto the adhesive material 60. These particles may, for example, be made of glass or sand. Alternatively, any other adhesion promoter may be deposited onto the adhesive material 60. The layer of the micro-fine oxidic particles or the adhesion promoter allows to form a firm mechanical bond with the sintered layer 15 during the sintering process. The adhesive material 60 may be cured before the semiconductor chips 12 are placed on the carrier 20 or during the sintering process.

When the sintering process is performed as described above and illustrated in FIG. 6C, a sintered layer 15 is formed between the contact elements 13 of the semiconductor chips 12 and the metal foil 10. The sintered layer 15 establishes an electrical coupling between the contact elements 13 and the metal foil 10. After curing the adhesive material 60 ensures a mechanical connection between the semiconductor chips 12 and the metal foil 12.

As illustrated in FIG. 6D, an encapsulation material 14 is deposited on the semiconductor chips 12 and the exposed surfaces of the sintered metal layer 15. The gaps between the semiconductor chips 12 are also filled with the encapsulation material 14. Thus the encapsulation material 14 covers the second main surfaces 31 and the side surfaces 32 of the semiconductor chips 12. The height $d_4$ of the encapsulation material 14 above the second main surfaces 31 of the semiconductor chips 12 may be at least 10 μm and, in particular, around 30 μm. After its deposition the encapsulation material 14 may provide planar sections on its upper surface, which are coplanar to the upper surface of the carrier 20.

The encapsulation material 14 used for covering the semiconductor chips 12 may be electrically insulating and made of a polymer or any other suitable material. The encapsulation material 14 may contain silicone or fluorinated silicone or may be entirely made of silicone. The encapsulation material 14 may further be a mixture of silicone and epoxy resin or a mixture of silicone and polyimide. After hardening, the encapsulation material 14 may have an elastic modulus of less than 100 MPa, in particular, less than 50 MPa or 20 MPa or 10 MPa or 5 MPa or 2 MPa or 1 MPa or 500 kPa or 200 kPa or 100 kPa or 50 kPa or 20 kPa. In particular, its elastic modulus may be around 3 MPa. The encapsulation material 14 may have a thermal conductivity, for example, in the range between 0.1 W/mK and 5 W/mK or higher. The encapsulation material 14 may exhibit low outgassing during cure and, in particular, low thixotropy. Elastosil may be used for the encapsulation material 14 though being highly thixotropic, for example, Elastosil RT705, which is commercially available.

The elastic modulus of the encapsulation material 14 as described above may allow a floating mounting of the semiconductor chips 12 with respect to the metal foil 61 which is placed over the semiconductor chips 12 later on. Due to the different thermal expansion coefficients of the semiconductor chips 12 and the metal foil 61, floating mounting of the semiconductor chips 12 is desired to reduce the mechanical stress induced during temperature cycles.

During its deposition the encapsulation material 14 may be fluid, viscous or waxy. The deposition of the encapsulation material 14 may, for example, be performed by stencil printing, screen printing, dispensing or any other appropriate method.

The metal foil 61 may be placed on top of the encapsulation material 12 as illustrated in FIG. 6E. The metal foil 61 may be made of an appropriate metal or metal alloy, such as copper or aluminum, and may have a thickness $d_5$ in the range between 50 and 100 μm.

After the deposition of the metal foil 61, the encapsulation material 14 may be cured (i.e. hardened) by a heat treatment at appropriate temperatures.

As illustrated in FIG. 6F, the semiconductor chips 12 covered with the encapsulation material 14 are released from the carrier 20 and the adhesive tape 21 by a heat treatment. Then a redistribution layer is built up on the metal foil as illustrated in FIG. 6G and described above in connection with FIGS. 3H-3L or, alternatively, FIGS. 4A-4E.

As illustrated in FIG. 6H, the devices 400 are separated from one another by separation of the metal foil 61, the encapsulation material 14 and the redistribution layer, for example, by sawing, cutting, milling, etching or a laser beam.

Figure 7:
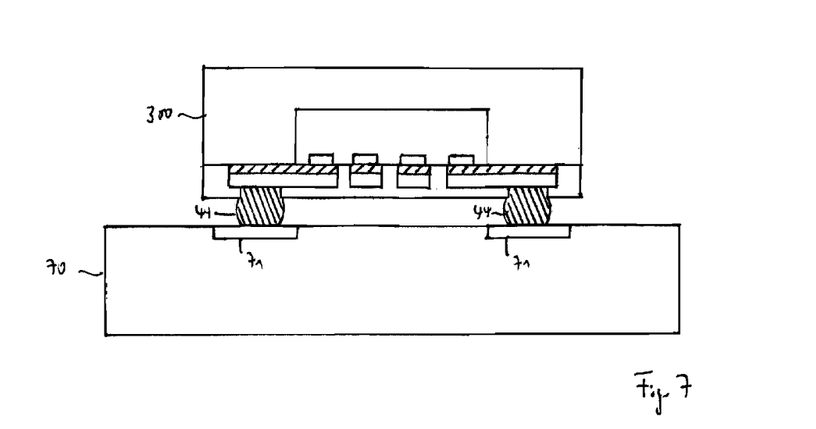
FIG. 7 schematically illustrates a cross-sectional view of one embodiment of a device mounted on a circuit board.

The devices 100, 200, 300 and 400 may be mounted on a circuit board 70, for example a PCB. In FIG. 7 the device 300 mounted on the circuit board 70 is exemplarily illustrated. The solder deposits 44 of the device 300 may face the circuit board 70. The circuit board 70 may have contact pads 71, and the device 300 may be soldered to the contact pads 71 by means of the solder deposits 44.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
applying metal particles to a metal foil;
placing a semiconductor chip over the metal foil with contact elements of the semiconductor chip facing the metal particles;
heating the metal particles; and
structuring the metal foil and the metal particles after heating the metal particles.

2. The method of claim 1, wherein the metal particles are heated until the semiconductor chip adheres to the metal foil.

3. The method of claim 1, wherein the metal particles are sintered.

4. The method of claim 1, wherein at least 50% of the metal particles have dimensions smaller than 100 nm.

5. The method of claim 1, further comprising depositing an encapsulation material over the semiconductor chip before the metal foil is structured.

6. The method of claim 5, wherein the encapsulation material has an elastic modulus of less than 100 MPa.

7. The method of claim 6, further comprising applying a further metal foil to the encapsulation material.

8. The method of claim 1, wherein portions of the metal foil form external contact pads.

9. A method, comprising:
applying metal particles to a metal foil;
placing a plurality of semiconductor chips over the metal foil;
heating the metal particles;
covering the plurality of semiconductor chips with a mold material after heating the metal particles; and
structuring the metal foil and the metal particles after covering the plurality of semiconductor chips with the mold material.

10. The method of claim 9, further comprising separating the plurality of the semiconductor chips from each other by cutting the mold material.

11. The method of claim 9, wherein the metal particles are sintered.

12. The method of claim 9, wherein at least 50% of the metal particles have dimensions smaller than 100 nm.

13. The method of claim 9, wherein placing the plurality of semiconductor chips over the metal foil comprises each semiconductor chip has a first main surface with contact elements arranged on the first main surface, a second main surface opposite to the first main surface and side surfaces, and
the plurality of semiconductor chips are placed over the metal foil with the first main surfaces of the semiconductor chips facing the metal particles, and wherein the first main surface of each semiconductor chip faces the metal particles.

14. The method of claim 13, wherein the second main surface and the side surfaces of each semiconductor chip are covered with the mold material.

15. A method, comprising:
applying metal particles to a metal foil;
applying an adhesive material having an elastic modulus of less than 100 MPa to a semiconductor chip;
placing the semiconductor chip over the metal foil with the adhesive material facing the metal foil;
heating the metal particles; and
structuring the metal foil after heating the metal particles.

16. The method of claim 15, wherein the metal particles are sintered.

17. The method of claim 15, wherein at least 50% of the metal particles have dimensions smaller than 100 nm.

18. The method of claim 15, further comprising applying an encapsulation material having an elastic modulus of less than 100 MPa to the semiconductor chip after the semiconductor chip is placed over the metal foil.

19. The method of claim 18, further comprising applying a further metal foil to the encapsulation material.

20. A device, comprising:
a semiconductor chip comprising contact elements located on a first main surface of the semiconductor chip;
an encapsulation body encapsulating the semiconductor chip, wherein a surface of the encapsulation body and the first main surface of the semiconductor chip form a common plane;
a layer of sintered metal particles disposed next to the contact elements at the common plane of the encapsulation body and the semiconductor chip; and
an adhesive material disposed next to the semiconductor chip;
a metal layer adjacent to the layer of the sintered metal particles and the adhesive material; and
an encapsulation body encapsulating the semiconductor chip.

21. The device of claim 20, wherein the encapsulation body has an elastic modulus of less than 100 MPa.

22. The device of claim 20, wherein the adhesive material has an elastic modulus of less than 100 MPa.

23. The device of claim 20, wherein portions of the metal layer form external contact pads.

24. The method of claim 1, wherein applying the metal particles to the metal foil comprises coating the metal foil with a paste layer containing the metal particles and a solvent.

25. The method of claim 24, wherein coating the metal foil comprises stencil printing the paste.

26. The method of claim 24, wherein heating the metal particles comprise evaporating the solvent so that the metal particles form a solid metal layer.

27. The method of claim 26, wherein the solid metal layer is a sintered metal layer.

28. The method of claim 1, further comprising depositing a dielectric layer over the structured metal foil and the metal particles.

29. The method of claim 9, wherein applying metal particles to the metal foil comprises disposing a paste on the metal foil, the paste containing metal particles and a solvent, wherein heating the metal particles comprises evaporating the solvent forming a sintered layer of metal particles, and wherein structuring the metal foil and the sintered layer of metal particles comprises etching the metal foil and the sintered layer of metal particles.

30. The device of claim 20, further comprising a dielectric layer disposed over the metal layer.

31. A method, comprising:
applying metal particles to a metal foil;
applying an adhesive material to a semiconductor chip;
placing the semiconductor chip over the metal foil with contact elements of the semiconductor chip facing the metal particles;
heating the metal particles; and
structuring the metal foil after heating the metal particles.

32. The method of claim 24, wherein the adhesive material has an elastic modulus of less than 100 MPa.

33. A device, comprising:
a semiconductor chip comprising contact elements located on a first main surface of the semiconductor chip;
an encapsulation body encapsulating the semiconductor chip, wherein a surface of the encapsulation body and the first main surface of the semiconductor chip form a common plane;
a layer of sintered metal particles at the common plane of the encapsulation body and the semiconductor chip;
a metal layer adjacent to the layer of the sintered metal particles; and
an adhesive material arranged between the semiconductor chip and the metal layer, the adhesive material having an elastic modulus of less than 100 MPa.

\* \* \* \* \*